United States Patent
Cheah et al.

(10) Patent No.: US 10,504,854 B2
(45) Date of Patent: Dec. 10, 2019

(54) THROUGH-STIFFENER INERCONNECTS FOR PACKAGE-ON-PACKAGE APPARATUS AND METHODS OF ASSEMBLING SAME

(71) Applicant: Intel Corporation, Santa Clara, CA (US)

(72) Inventors: Bok Eng Cheah, Bukit Gambir (MY); Seok Ling Lim, Kulim (MY); Jenny Shio Yin Ong, Bayan Lepas (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/018,984

(22) Filed: Jun. 26, 2018

(65) Prior Publication Data
US 2019/0181097 A1 Jun. 13, 2019

(30) Foreign Application Priority Data

Dec. 7, 2017 (MY) .......................... PI 2017704712

(51) Int. Cl.
| | | |
|---|---|---|
| *H01L 23/552* | (2006.01) | |
| *H01L 23/16* | (2006.01) | |
| *H01L 23/00* | (2006.01) | |
| *H01L 25/10* | (2006.01) | |
| *H01L 25/18* | (2006.01) | |
| *H01L 25/00* | (2006.01) | |

(52) U.S. Cl.
CPC ............ *H01L 23/552* (2013.01); *H01L 23/16* (2013.01); *H01L 24/19* (2013.01); *H01L 24/20* (2013.01); *H01L 25/105* (2013.01); *H01L 25/18* (2013.01); *H01L 25/50* (2013.01); *H01L 23/562* (2013.01); *H01L 2224/214* (2013.01); *H01L 2225/1035* (2013.01); *H01L 2225/1058* (2013.01); *H01L 2924/1431* (2013.01); *H01L 2924/1434* (2013.01); *H01L 2924/3025* (2013.01)

(58) Field of Classification Search
CPC ..... H01L 23/16; H01L 23/552; H01L 23/562; H01L 24/19; H01L 24/20; H01L 25/18; H01L 25/50; H01L 25/105; H01L 2224/214; H01L 2225/1058; H01L 2924/1434

See application file for complete search history.

(56) References Cited

U.S. PATENT DOCUMENTS

| | | | | |
|---|---|---|---|---|
| 7,842,541 B1* | 11/2010 | Rusli | ................. | H01L 23/49833 438/106 |
| 7,872,343 B1* | 1/2011 | Berry | .................... | H01L 21/561 257/687 |
| 8,748,232 B2* | 6/2014 | Samoilov | .......... | H01L 21/76898 438/118 |
| 2005/0194180 A1* | 9/2005 | Kirby | ................... | G01R 1/0735 174/267 |

(Continued)

*Primary Examiner* — Allan R Wilson
(74) *Attorney, Agent, or Firm* — Schwegman Lundberg & Woessner, P.A.

(57) ABSTRACT

A stiffener includes a through-stiffener interconnect that couples a semiconductor package substrate to a package-on-package device. The through-stiffener interconnect is insulated by a through-stiffener dielectric within a through-stiffener contact corridor. A semiconductive die is coupled to the semiconductor package substrate and to the package-on-package device.

4 Claims, 7 Drawing Sheets

(56) References Cited

U.S. PATENT DOCUMENTS

| | | | |
|---|---|---|---|
| 2013/0032388 A1* | 2/2013 | Lin | H01L 23/3121 |
| | | | 174/261 |
| 2014/0070423 A1* | 3/2014 | Woychik | H01L 23/49833 |
| | | | 257/774 |
| 2014/0246227 A1* | 9/2014 | Lin | H01L 21/4857 |
| | | | 174/266 |
| 2015/0235991 A1* | 8/2015 | Gu | H01L 25/0655 |
| | | | 257/762 |
| 2015/0311185 A1* | 10/2015 | Ng | H01L 25/18 |
| | | | 257/784 |
| 2017/0162556 A1* | 6/2017 | Lin | H01L 25/50 |

* cited by examiner

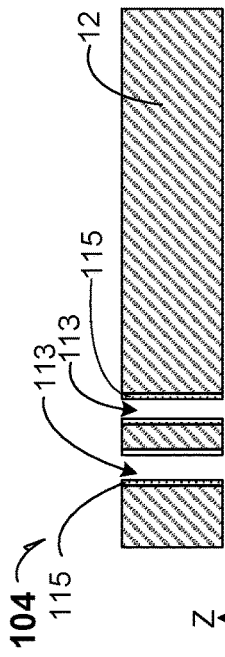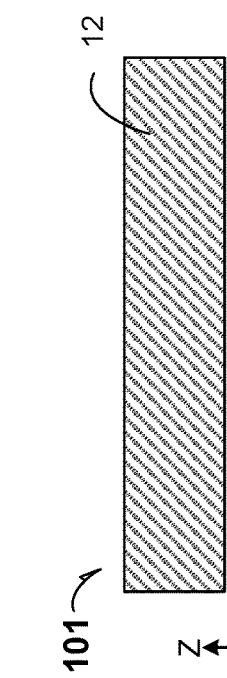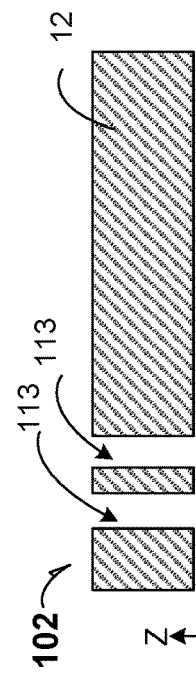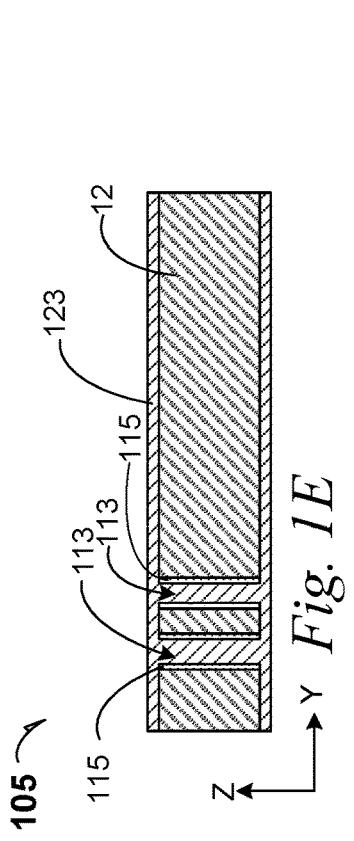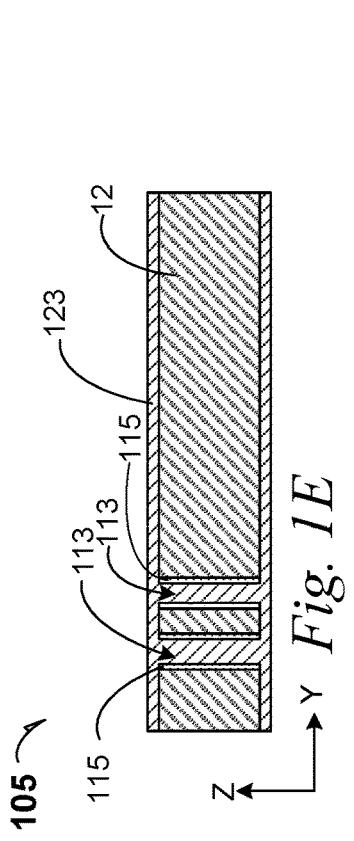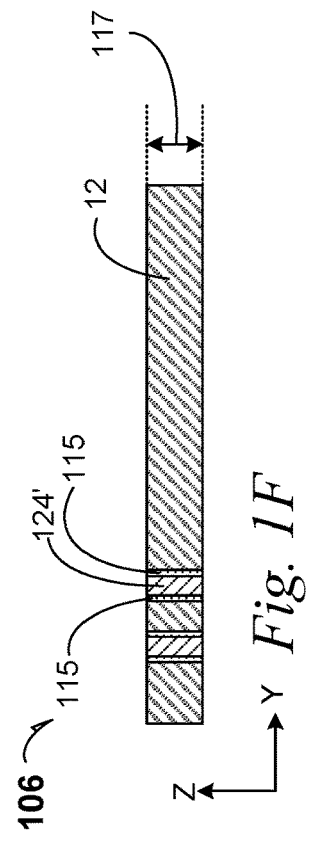

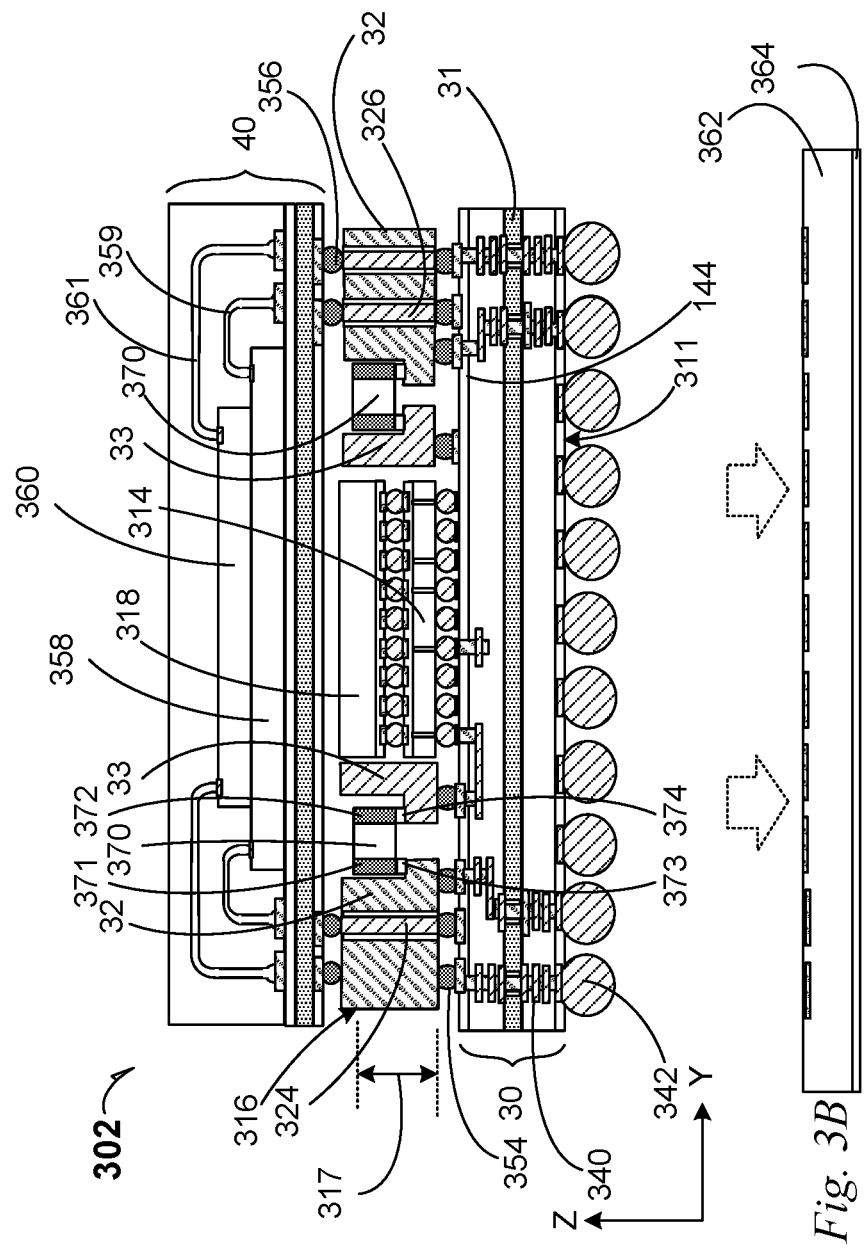

THROUGH-STIFFENER INTERCONNECTS FOR PACKAGE-ON-PACKAGE APPARATUS AND METHODS OF ASSEMBLING SAME

PRIORITY APPLICATION

This application claims the benefit of priority to Malaysian Application Serial Number PI 2017704712, filed Dec. 7, 2017, which is incorporated herein by reference in its entirety.

FIELD

This disclosure relates to semiconductor package stiffeners and to interconnects that pass through the stiffeners. The interconnects are used for package-on-package apparatus for smaller form-factor packaging.

BACKGROUND

Semiconductive device miniaturization during packaging includes challenges to manage semiconductor package physical integrity while allowing communication between multiple connected semiconductor packages.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of a stiffener precursor during fabrication of a stiffener according to an embodiment;

FIG. 1B is a cross-section elevation of the stiffener after further fabrication according to an embodiment;

FIG. 1C is a cross-section elevation of the stiffener after further fabrication according to an embodiment;

FIG. 1D is a cross-section elevation of the stiffener after further fabrication according to an embodiment;

FIG. 1E is a cross-section elevation of the stiffener after further fabrication according to an embodiment;

FIG. 1F is a cross-section elevation of the stiffener after further fabrication according to an embodiment;

FIG. 3B is a cross-section elevation of the semiconductor package apparatus after further processing according to an embodiment;

DETAILED DESCRIPTION

Semiconductor packages are formed with a package-on-package (POP) apparatus configuration that includes electrical communication through a stiffener between the lower package and the POP apparatus. High density electrical communication passes through the insulated stiffener, and the source voltage, or ground (Vss) reference voltage, is shunted into the stiffener. A source voltage structure is electrical wiring including interlayer metallization as well as an electrical bump that is associated with a ground (Vss) reference voltage and coupled to the semiconductor package substrate. Electromagnetic interference (EMI) noise is reduced by a shielding effect of the metallic stiffener associated with a reference voltage e.g., ground (Vss) reference voltage. Consequently, the stiffener provides both smaller X-Y footprint form factors for POP apparatus, as well as EMI shielding. Additionally, the stiffener provides several through-stiffener interconnects (TSIs) that include both power/ground and I/O for the POP apparatus configuration.

This disclosure includes package form-factor miniaturization that reduces X-Y semiconductor package footprints by incorporating input/output (I/O) and power and ground through-stiffener interconnects (TSIs) through a die-side package stiffener for the POP device that is mounted above the stiffener.

By incorporating power/ground and high-density I/O routing into the stiffener, the semiconductor package substrate can have more space for larger or a higher number of active devices disposed on the die side of the semiconductor package substrate. The die-side stiffener also provides mechanical support to facilitate both thin-package substrate with a core layer, and thin-package substrate coreless stack-ups. The stiffener allows for a low-Z direction package profile.

Figure 1:
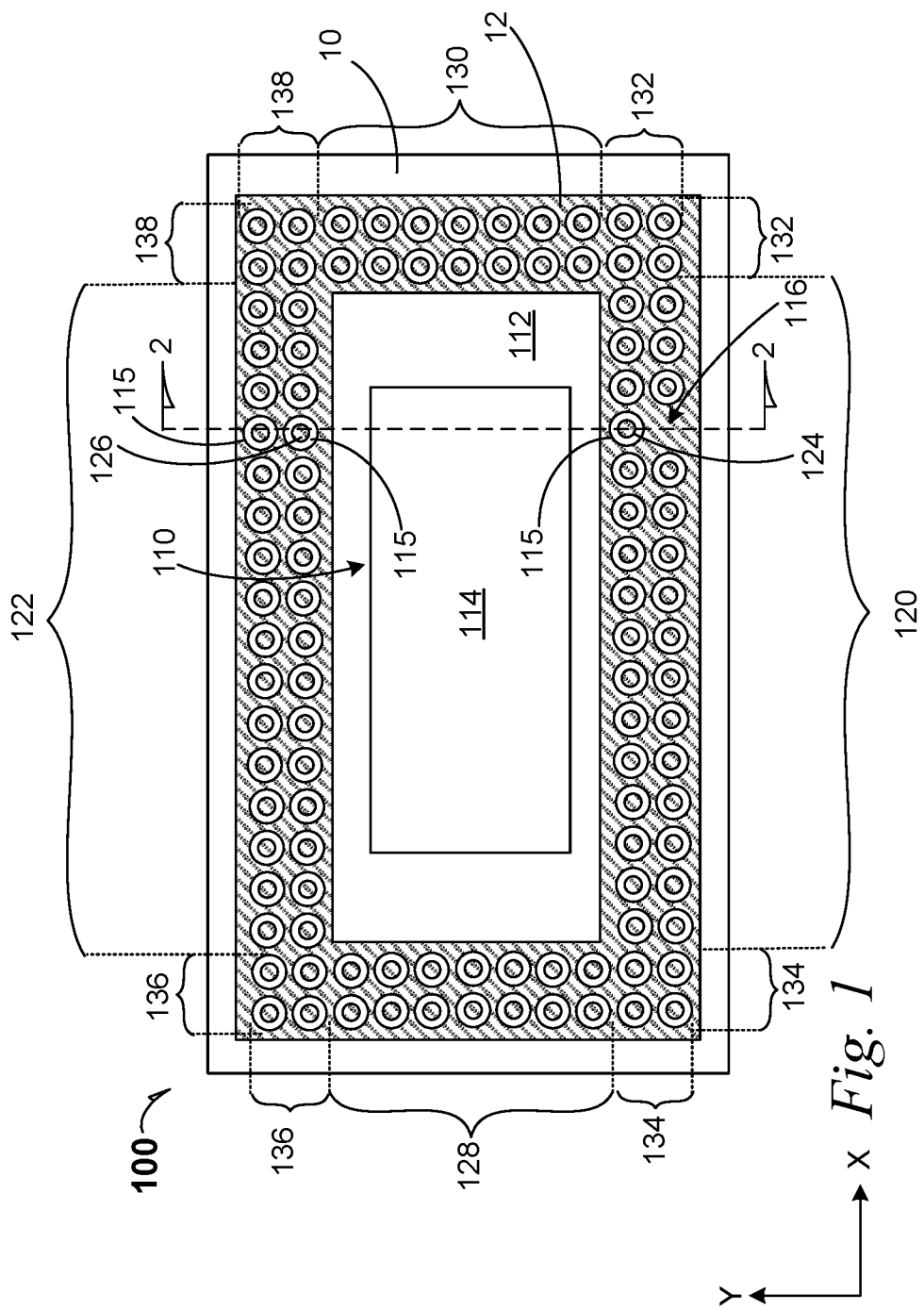
FIG. 1 is a top plan of a semiconductor package that includes a semiconductor package substrate, a stiffener and a package substrate infield on a die side of the semiconductor package substrate according to an embodiment.

FIG. 1 is a top plan of a semiconductor package 100 that includes a semiconductor package substrate 10, a stiffener 12 and a package substrate infield 110 on a die side 112 of the semiconductor package substrate 10 according to an embodiment. The package substrate infield 110 is created by the stiffener 12 as it is located near the periphery of the semiconductor package substrate 10.

Figure 2A:
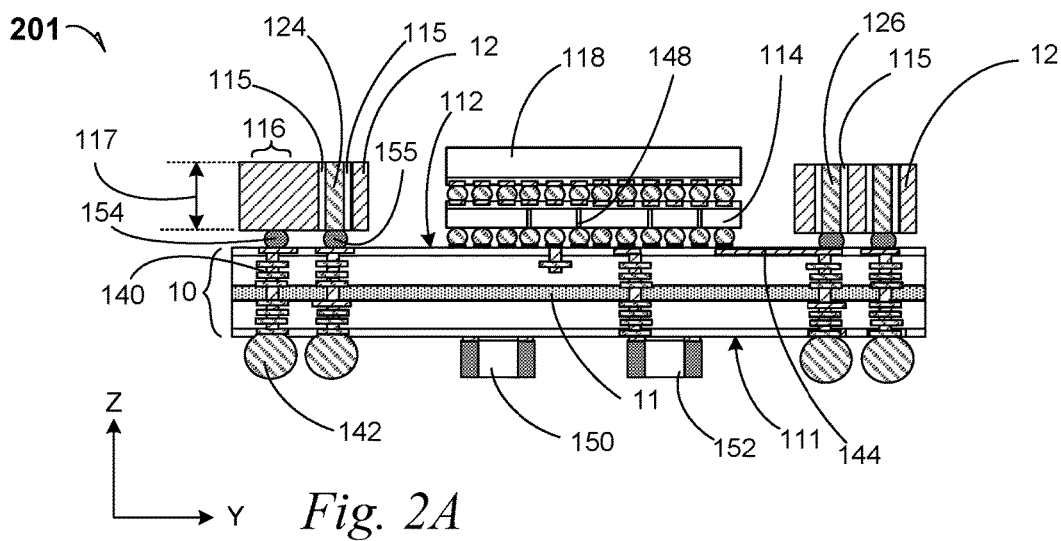
FIG. 2A is a cross-section elevation of a semiconductor package during assembly according to an embodiment.

Although there are several structures within disclosed semiconductor device package embodiments, a "stiffener" embodiment is defined as the most rigid structure within the package, such as a metal material, but the stiffener structure is external to the semiconductor package substrate. As depicted in FIG. 2A, the stiffener 12 is the most rigid structure within the semiconductor package 201, and where a substrate core 11 may also be rigid, the substrate core 11 is integral and internal to the semiconductor package substrate 10. Compared to an interposer structure, stiffener structure embodiments create an infield when assembled to a semiconductor package substrate.

In an embodiment, a single semiconductive die 114 is mounted on the package substrate 10 in the infield 110 that is formed by the stiffener 12. In an embodiment, a plurality of dice is located on the die side 112 within the infield 110. For example, at least two dice may be seated on the die side 112 in a side-by-side configuration (not picture), such as dividing the illustrated die as two side-by-side dice on the die side within the infield 110.

Figure 2B:
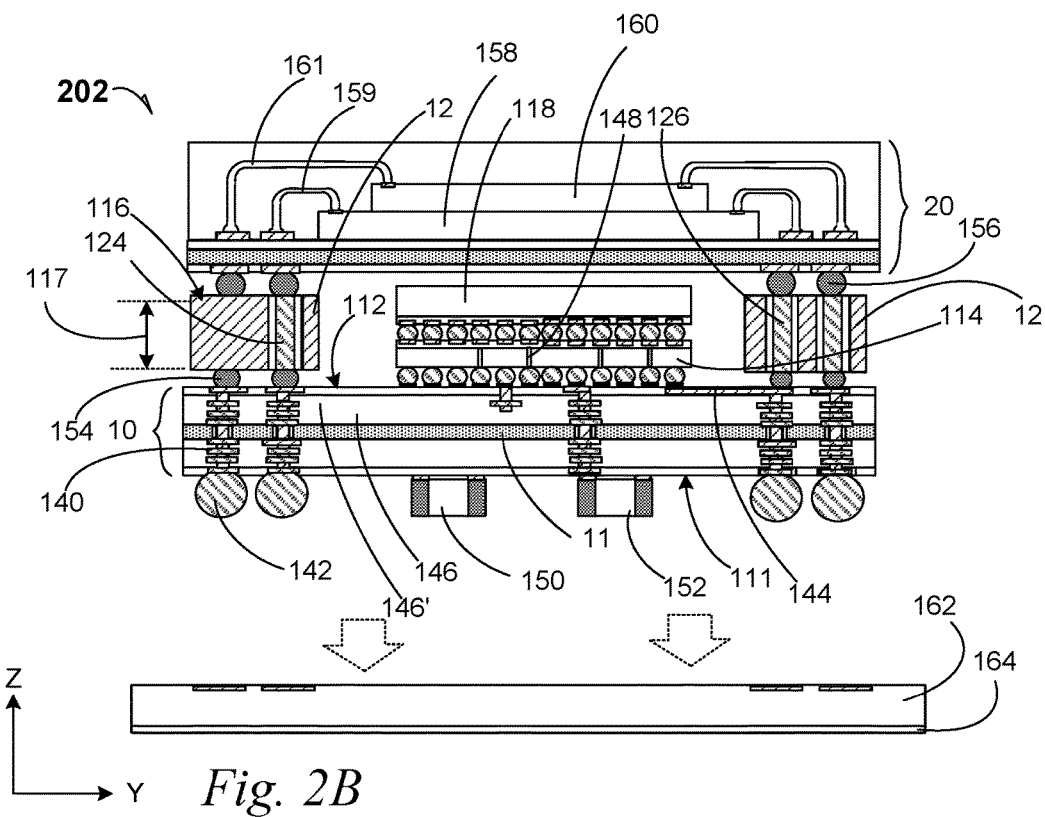
FIG. 2B is a cross-section elevation of the semiconductor package apparatus after further processing according to an embodiment.

In an example embodiment, at least two dice are stacked within the infield 110 (see FIGS. 2A and 2B). In an embodiment, the semiconductive die 114 is a processor die made by Intel Corporation of Santa Clara, Calif. In an embodiment, the semiconductor die 114 is a processor die 114 that may be seated on the die side 112 in connection with a platform-controller hub (PCH) die (not pictured) stacked on or beneath the processor die 114.

In an embodiment, the stiffener 12 is made from aluminum-containing metal. In an embodiment, the stiffener 12 is made from copper-containing metal. In an embodiment, the stiffener 12 is made from a metal or a metal alloy. In an embodiment, the stiffener 12 presents a Z-direction profile 117 (see FIGS. 1F, 2A and 2B) in a range from 100 micrometer (μm) to 400 μm.

FIG. 1A is a cross-section elevation 101 of a stiffener precursor during fabrication of a stiffener according to an embodiment. A stiffener blank 12 is provided such as any of the above-mentioned metal embodiments.

FIG. 1B is a cross-section elevation 102 of the stiffener 12 after further fabrication according to an embodiment. The stiffener 12 has been drilled to form through-stiffener interconnect (TSI) contact corridors 113. In an embodiment, a physical drill technique bit is used. In an embodiment, a laser drill technique is used. In an embodiment, a combination of a physical drill bit technique and a laser drill technique is used.

FIG. 1C is a cross-section elevation 103 of the stiffener 12 after further fabrication according to an embodiment. The TSI contact corridors 113 (see FIG. 1B) have been filled with a TSI dielectric 115 in preparation for electrically insulating the stiffener 12 and the TSIs that are to be formed within the TSI contact corridors 113.

FIG. 1D is a cross-section elevation 104 of the stiffener 12 after further fabrication according to an embodiment. The TSI contact corridors 113 have been reopened through the TSI dielectric 115. In an embodiment, the TSI contact corridors 113 are drilled out through TSI dielectric 115 by using a mechanical drill bit, but the TSI dielectric 115 covers the surfaces within the TSI contact corridors 113. In an embodiment, the thickness of the TSI dielectric 115 that covers the surfaces within the TSI contact corridors 113 ranges from 10 micrometer (μm) to 40 μm.

FIG. 1E is a cross-section elevation 105 of the stiffener 12 after further fabrication according to an embodiment. An interconnect plating layer 123 is formed over the stiffener 12 and into the TSI contact corridors 113 including covering the TSI dielectric 115. In an embodiment, the plating layer 123 is a copper-containing metal. In an embodiment, the plating layer 123 is a silver-containing metal. In an embodiment, the plating layer 123 is a metal or metal alloy.

FIG. 1F is a cross-section elevation 106 of the stiffener 12 after further fabrication according to an embodiment. In an embodiment, a back-grinding process has been carried out to remove the plating layer 123 from the stiffener 12 except within the TSI contact corridors 113. In an embodiment, the stiffener 12 presents a Z-direction profile 117 (see also FIGS. 2A and 2B) in a range from 100 μm to 400 μm.

As illustrated a through-stiffener interconnect (TSI) 124' is insulated within the stiffener 12 with the TSI dielectric 115. Hereinafter, insulated through-stiffener interconnects such as item 124' may be referred to as a TSI 124'. In an embodiment, the diameter of the TSI 124' ranges from 100 μm to 400 μm.

Reference is again made to FIG. 1. The stiffener 12 is depicted with a first TSI 124 within a first rail portion 120 as projected by the fine-dashed lines from the bracket 120 onto the stiffener 12. The first TSI 124 is insulated with the TSI dielectric 115 and is located within the first rail portion 120. Similarly, a subsequent TSI 126 is depicted with a subsequent rail portion 122 and it is also insulated with an occurrence of the TSI dielectric 115.

In an embodiment, a third rail portion 128 is seen between the first rail portion 120 and the subsequent rail portion 122, and the third rail portion 128 runs along a Y-direction.

Similarly in an embodiment, a fourth rail portion 130 is seen between the first rail portion 120 and the subsequent rail portion 122, and opposite the third rail portion 128. The fourth rail portion 130 runs along a Y-direction as does the third rail portion 128.

Other stiffener portions include corner portions 132, 134, 136 and 138. Each corner portion is located between two adjacent and orthogonally arranged rail portions. For example, the corner portion 136 is located between the third rail portion 128 and the subsequent rail portion 122, which are arranged orthogonally extending from the corner portion 136.

Adjacent the first TSI 124 is an interstitial ground site 116 that is found on the stiffener 12, and the interstitial ground site 116 may be located adjacent a TSI, or among several TSIs. As illustrated, the interstitial ground site 116 is located adjacent the first TSI 124 and among a total of three adjacent TSIs. In an embodiment, the ground site 116 is not particularly near any TSI, but it is so designated as an electrical connection contacts the stiffener 12 and the stiffener 12 is coupled to the source voltage such as ground (Vss) reference voltage.

Although only one interstitial ground site 116 is illustrated, several interstitial ground sites may be located along useful portions of the stiffener 12 depending upon a given application.

FIG. 2A is a cross-section elevation of a semiconductor package 201 during assembly according to an embodiment. Structures similar to those depicted in FIG. 1 can be seen in FIG. 2A. The depiction in FIG. 2A can be seen by taking a cross section from FIG. 1 along the large-dashed section line 2-2.

A semiconductor package substrate 10 includes a substrate core 11 in an embodiment. The semiconductor package substrate 10 supports a stiffener 12 on a die side 112 of the semiconductor package 201 according to an embodiment. In an embodiment as depicted, the core 11 of the semiconductor package substrate 10 is provided, but in an embodiment, the semiconductor package substrate 10 is coreless and useful stiffness for the semiconductor package 201 is provided in part by the stiffener 12.

As illustrated, the interstitial ground site 116 is located adjacent the first TSI 124. Grounding of the stiffener 12 is illustrated with a vertical-downward (negative-Z direction) of metallization components 140, through the semiconductor package substrate 10 to a ball-grid array 142 (one electrical bump 142 is enumerated) on a land side 111 that is opposite the die side 112. The ball-grid array 142 associated to the ground (Vss) reference voltage is coupled to the voltage source resided on or within the board (e.g. board 162 in FIG. 2B) through example printed circuit board routing. In an embodiment (not shown), the grounding of the stiffener 12 is accomplished through direct coupling of the stiffener 12 to the reference voltage source resided within semiconductive die such as semiconductive die 114 or semiconductive die 118 through package routing traces without transitioning through the package substrate core 11.

In an embodiment, the stiffener 12 is grounded to the source (VSS) voltage, and the stiffener 12 also is coupled to the semiconductor package substrate 10 at a source voltage structure such as the metallization components 140 as well as a die-side solder bump 154 that electrically contacts the stiffener 12. As illustrated, the enumerated die-side solder bump 154 directly contacts the stiffener 12, whereas the adjacent die-side solder bump 155 is electrically insulated from the stiffener 12 by the TSI dielectric 115.

In an embodiment, a stacked semiconductive die 118 is mounted above the semiconductive die 114, which is mounted on the package substrate 10 in the infield 110 that is formed by the stiffener 12. The first semiconductive die 114 and the stacked semiconductive die 118 are face-to-face contacted. In an embodiment, a through-silicon via (TSV) 148 allows communication between the stacked semiconductive die 118, through the semiconductive die 114 and into the semiconductor package substrate 10. In an embodiment, the semiconductive die 114 is a platform-controller hub (PCH) die and the stacked semiconductive die 118 is a logic processor die 118. In an embodiment, the PCH die 114 is part of a chipset (see FIG. 5).

In an embodiment, a decoupling capacitor 150 is mounted on the land side 111 of the semiconductor package substrate 10, and the decoupling capacitor 150 provides decoupling service to at least one of the first die 114 and the first stacked die 118. In an embodiment, a subsequent decoupling capacitor 152 is also provided on the land side 111 for further decoupling capacitance function. As illustrated the decoupling capacitor 152 is coupled through the semiconductor package substrate 10 to an electrical bump that contacts the semiconductive die 114.

In an embodiment, a plurality of decoupling capacitors, more than two, is located on the land side 111. In an embodiment, the plurality of decoupling capacitors includes from two to up to 14 when more than one die is mounted on the die side 112. Consequently, a portion of the decoupling capacitors service a first die such as the first die 114, and the remainder of the decoupling capacitors service a subsequent die (not illustrated) that is also mounted on the die side 112.

FIG. 2B is a cross-section elevation of the semiconductor package apparatus 201 after further processing according to an embodiment. The semiconductor package apparatus 202 has been assembled to a POP package 20 that is bonded to the stiffener 12. The semiconductor package apparatus 202 may be referred to as a TSI POP apparatus 202. Whereas the semiconductor package substrate 10 is bonded to the stiffener 12 with a series of die-side solder bumps 154 and 155, the POP package 20 is bonded to the stiffener 12 with a series of POP-side solder bumps 156. After reflow processing, the die-side solder bumps 154, 155 and the POP-side solder bumps 156 form solidified electrical bumps.

In an embodiment, the POP package 20 includes a first memory die 158 that is wire-bonded 159 and electrically connected through the stiffener 12 for electrical coupling to the semiconductive die 114 or the semiconductive die 118 through the semiconductor package substrate 10. In an embodiment, the POP package 20 includes a stacked die 160 that is stacked on the first memory die 158, and that is wire-bonded 161 and electrically connected through the stiffener 12 for electrical coupling to the semiconductive die 114 or the semiconductive die 118 through the semiconductor package substrate 10.

As depicted in FIG. 2B in an embodiment and as may be present for all TSI POP apparatus embodiments in this disclosure, the electrical ball-grid array 142 is seated onto a board 162 such as a motherboard 162. In an embodiment, the board 162 includes a physical and electrically insulative shell 164 such as the outer shell 164 of a computing system. Processing to seat the TSI POP package apparatus 202 onto the board 162 is illustrated by the directional arrows, depicted in dashed lines, that illustrate movement of the TSI POP apparatus 202 toward the board 162.

Figure 3A:
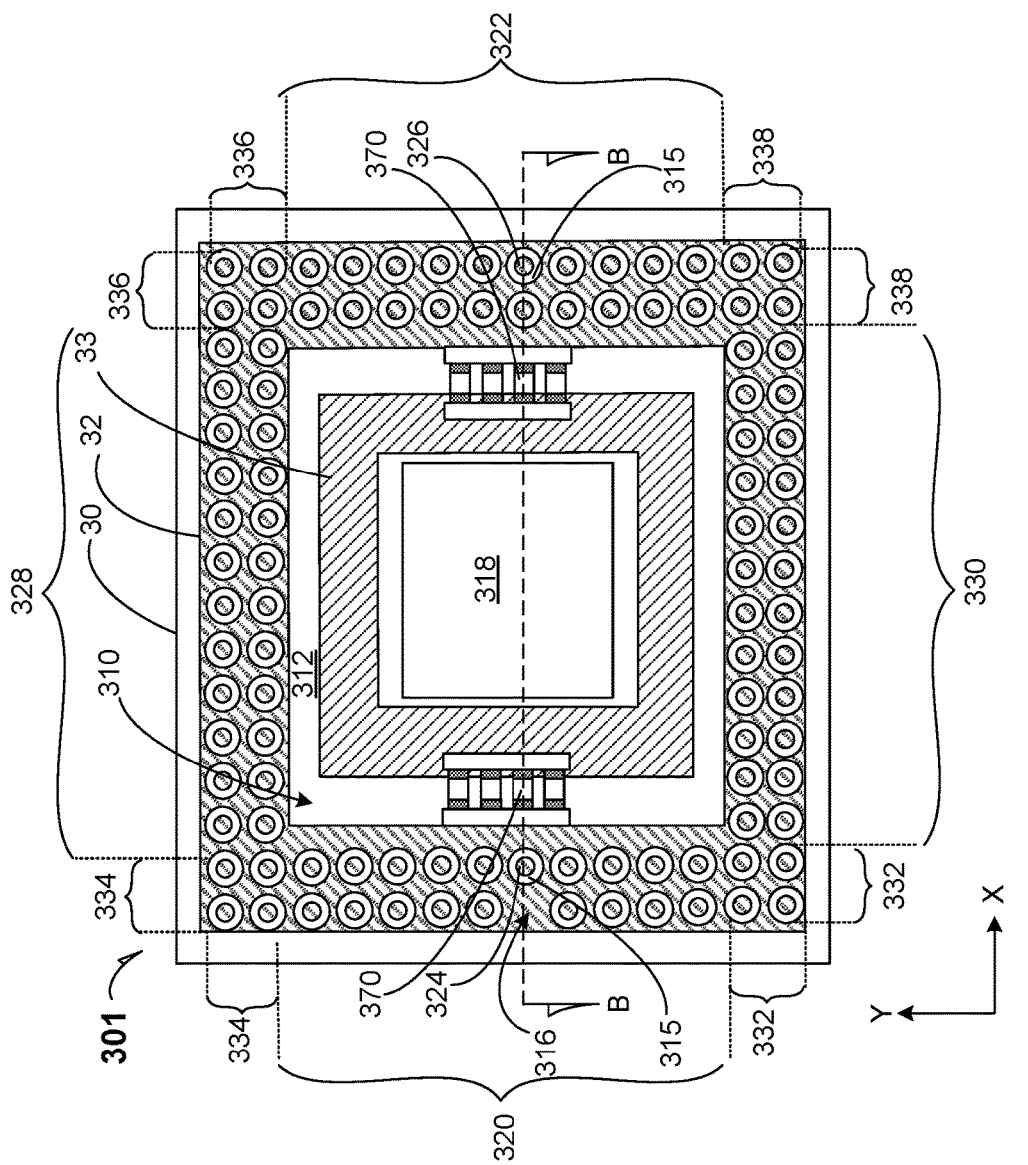
FIG. 3A is a top plan of a semiconductor package that includes a semiconductor package substrate, a TSI stiffener, a subsequent stiffener and a package substrate infield on a die side of the semiconductor package substrate according to an embodiment.

FIG. 3A is a top plan of a semiconductor package 301 that includes a semiconductor package substrate 30, a TSI stiffener 32, a subsequent stiffener 33 and a package substrate infield 310 on a die side 312 of the semiconductor package substrate 30 according to an embodiment. The package substrate infield 310 is created by the TSI stiffener 32 as it is located near the periphery of the semiconductor package substrate 30. As illustrated, the subsequent stiffener 33 is surrounded by the TSI stiffener 32. The subsequent stiffener 33 is also located within the package substrate infield 310, and the subsequent stiffener 33 allows a passive device 370 to bridge between the TSI stiffener 32 and the subsequent stiffener 33.

In an embodiment, a stacked semiconductive die 318 is face-to-face mounted on a bottom semiconductive die (see item 314, FIG. 3B), which is seated on the package substrate 30 in the infield 310 that is formed by the TSI stiffener 32. In an embodiment, a plurality of dice is located on the die side 312 within the infield 310. For example, at least two dice may be seated on the die side 312 in a side-by-side configuration. In an example embodiment as illustrated in FIG. 3B, at least two dice are stacked within the infield 310. In an embodiment, the stacked semiconductive die 318 is a processor die made by Intel Corporation of Santa Clara, Calif. In an embodiment, the bottom semiconductor die 314 (not pictured) is a platform-controller hub (PCH) die 314 that may be seated on the die side 312 in connection with a processor die 318 stacked on the platform-controller hub (PCH) die 314.

In an embodiment, the TSI stiffener 32 is made from aluminum-containing metal. In an embodiment, the TSI stiffener 32 is made from copper-containing metal. In an embodiment, the TSI stiffener 32 is made from a metal or a metal alloy. In an embodiment, the TSI stiffener 32 presents a Z-direction profile 317 (see FIG. 3B) in a range from 100 micrometer (μm) to 400 μm. In an embodiment, the subsequent stiffener 33 is made from aluminum-containing metal. In an embodiment, the subsequent stiffener 33 is made from copper-containing metal. In an embodiment, the subsequent stiffener 33 is made from a metal or a metal alloy. In an embodiment, the subsequent stiffener 33 presents a Z-direction profile 317 (see FIG. 3B) in a range from 100 μm to 400 μm.

The TSI stiffener 32 is depicted with a first TSI 324 within a first rail portion 320 that is depicted in FIG. 3A by the fine-dashed lines from the bracket 320 onto the TSI stiffener 32. The first TSI 324 is insulated with a TSI dielectric 315 and is located within the first rail portion 320. Similarly, a subsequent TSI 326 is depicted with a subsequent rail portion 322 and it is also insulated with an occurrence of the TSI dielectric 315.

In an embodiment, a third rail portion 328 is seen between the first rail portion 320 and the subsequent rail portion 322, and the third rail portion 328 runs along an X-direction. Similarly in an embodiment, a fourth rail portion 330 is seen between the first rail portion 320 and the subsequent rail portion 322, and opposite the third rail portion 328. The fourth rail portion 330 runs along an X-direction as does the third rail portion 328.

Other stiffener portions include corner portions 332, 334, 336 and 338. Each corner portion is located between two adjacent and orthogonally arranged rail portions. For example, the corner portion 336 is located between the third rail portion 328 and the subsequent rail portion 322, which are arranged orthogonally extending from the corner portion 336.

Adjacent the first TSI 324 is an interstitial ground site 316 that is found on the TSI stiffener 32, and the interstitial ground site 316 may be located adjacent a TSI, or among several TSIs. As illustrated, the interstitial ground site 316 is located adjacent the first TSI 324 and among a total of three adjacent TSIs. The ground site 316 may not be particularly near any given TSI in an embodiment but it is so designated as an electrical connection contacts the stiffener 32 and the stiffener 32 is coupled to the source voltage such as ground (Vss) reference voltage. Although only one interstitial ground site 316 is illustrated, several interstitial ground sites may be located along useful portions of the TSI stiffener 32 depending upon a given application.

FIG. 3B is a cross-section elevation of the semiconductor package apparatus 302 after further processing according to an embodiment. The semiconductor package apparatus 302 has been assembled to a POP package 40 that is bonded to the TSI stiffener 32. The semiconductor package apparatus 302 may be referred to as a die-side passives TSI POP apparatus 302. Whereas the semiconductor package substrate 30 is bonded to the TSI stiffener 32 with a series of die-side solder bumps 354, the POP package 40 is bonded to the TSI stiffener 32 with a series of POP-side solder bumps 356. After reflow processing, the die-side solder bumps 354 and the POP-side solder bumps 356 form solidified electrical bumps.

In an embodiment, the POP package 40 includes a first memory die 358 that is wire-bonded 359 and electrically connected though the TSI stiffener 32 for electrical coupling to the semiconductive die 314 or the semiconductive die 318 through the semiconductor package substrate 30. In an embodiment, the POP package 40 includes a stacked die 360 that is stacked on the first memory die 358, and that is wire-bonded 361 and electrically connected through the TSI stiffener 32 for electrical coupling to the semiconductive die 314 or the semiconductive die 318 through the semiconductor package substrate 30.

In an embodiment, the subsequent stiffener 33 allows for a passive device 370 to bridge across the TSI stiffener 32 and the subsequent stiffener 33. In an embodiment, the passive device 370 is a capacitor 370 and the subsequent stiffener 33 is a power rail 33 that allows a discharge occurs across the capacitor 370. In an embodiment, a first terminal 371 of the capacitor 370 is coupled to the TSI stiffener 32 that is associated with a ground (Vss) reference voltage through solder connection 373. In an embodiment, a second terminal 372 of the capacitor 370 is coupled to the subsequent stiffener 33 that is associated with a power (Vcc) reference voltage through solder connection 374. In an embodiment, the subsequent stiffener 33 is further segmented into two or more sub-segments (not shown) and each sub-segment is coupled to a power (Vcc) reference voltage. In an embodiment, each of the sub-segment is coupled to power (Vcc) reference voltage different from one another. By locating the passive devices 370 on the die side, the land side 311 allows for a complete population on the land side 311, of electrical bumps 342 as a ball grid array to mount on a board.

As depicted in FIG. 3B and in an embodiment for optionally all TSI POP apparatus embodiments in this disclosure, the electrical ball-grid array 342 is seated onto a board 362 such as a motherboard 362. In an embodiment, the board 362 includes a physical and electrically insulative shell 364 such as the outer shell 364 of a computing system. Processing to seat the die-side passive TSI POP package apparatus 302 onto the board 362 is illustrated by the directional arrows, depicted in dashed lines, that illustrate movement of the die-side passive TSI POP apparatus 302 toward the board 362.

Figure 4:
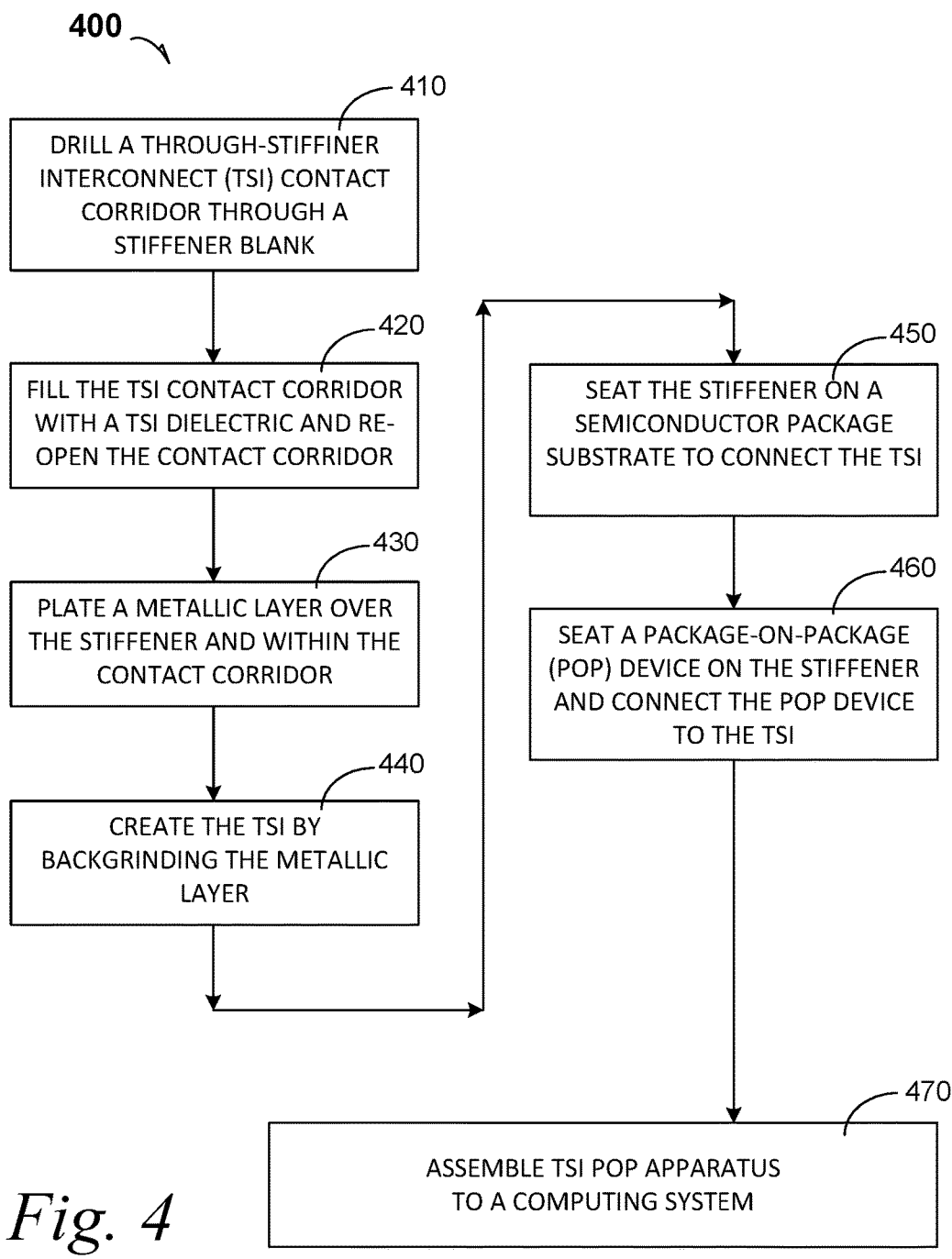
FIG. 4 is a process flow diagram according to an embodiment.

FIG. 4 is a process flow diagram 400 according to an embodiment.

At 410, the process includes drilling a TSI contact corridor through a stiffener blank. In a non-limiting example embodiment, the TSI contact corridor is achieved by a technique other than drilling such as by etching.

At 420, the process includes filling the TSI contact corridor with a TSI dielectric, followed by re-opening the TSI contact corridor in the TSI dielectric.

At 430, the process includes plating a metallic layer within the TSI contact corridor on the TSI dielectric.

At 440, the process includes creating the TSI by back-grinding the metallic layer.

At 450, the process includes seating the stiffener on a semiconductor package substrate to connect the TSI.

At 460, the process includes seating a POP device on the stiffener and to connect the POP device to the TSI.

At 470, the process includes assembling the TSI POP apparatus to a computing system.

Figure 5:
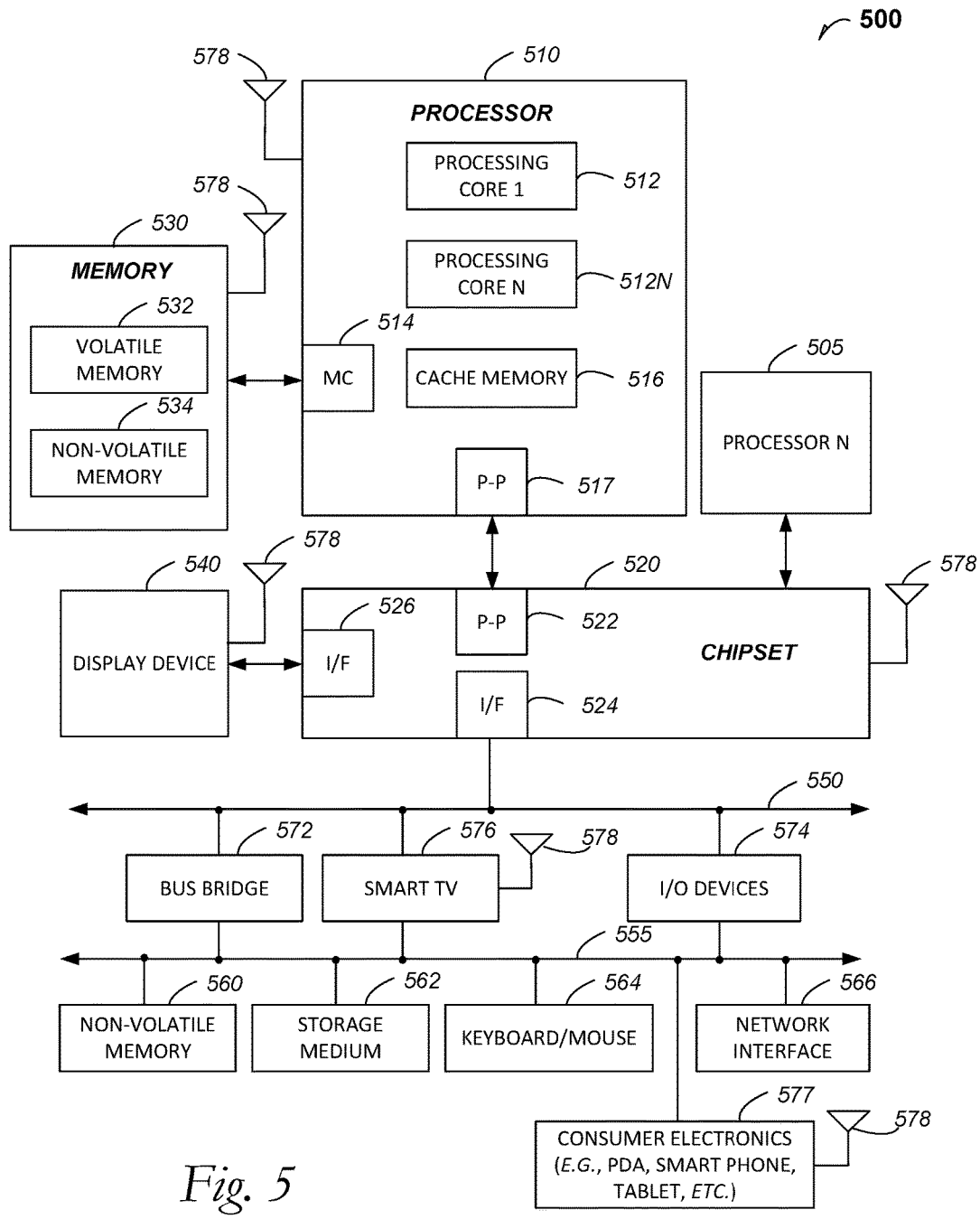
FIG. 5 is included to show an example of a higher-level device application for the disclosed embodiments.

FIG. 5 is included to show an example of a higher-level device application for the disclosed embodiments. The TSI POP apparatus embodiments may be found in several parts of a computing system. In an embodiment, the TSI POP apparatus is part of a communications apparatus such as is affixed to a cellular communications tower. The TSI POP apparatus may also be referred to as composite stiffener incorporating a passive device apparatus. In an embodiment, a computing system 500 includes, but is not limited to, a desktop computer. In an embodiment, a system 500 includes, but is not limited to a laptop computer. In an embodiment, a system 500 includes, but is not limited to a netbook. In an embodiment, a system 500 includes, but is not limited to a tablet. In an embodiment, a system 500 includes, but is not limited to a notebook computer. In an embodiment, a system 500 includes, but is not limited to a personal digital assistant (PDA). In an embodiment, a system 500 includes, but is not limited to a server. In an embodiment, a system 500 includes, but is not limited to a workstation. In an embodiment, a system 500 includes, but is not limited to a cellular telephone. In an embodiment, a system 500 includes, but is not limited to a mobile computing device. In an embodiment, a system 500 includes, but is not limited to a smart phone. In an embodiment, a system 500 includes, but is not limited to an internet appliance. Other types of computing devices may be configured with the microelectronic device that includes TSI POP apparatus embodiments.

In an embodiment, the processor 510 has one or more processing cores 512 and 512N, where 512N represents the Nth processor core inside processor 510 where N is a positive integer. In an embodiment, the electronic device system 500 using a TSI POP apparatus embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the TSI POP apparatus in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520.

The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using a TSI POP apparatus embodiment as set forth in this disclosure. The chipset 520 enables the processor 510 to connect to other elements in the TSI POP apparatus embodiments in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least do one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into a TSI POP apparatus in a system. Additionally, the chipset 520 connects to one or more buses 550 and 555 that interconnect various elements 574, 560, 562, 564, and 566. Buses 550 and 555 may be interconnected together via a bus bridge 572 such as at least one TSI POP apparatus embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the TSI POP apparatus embodiment in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

Where useful, the computing system 500 may have a broadcasting structure interface such as for affixing the TSI POP apparatus to a cellular tower.

To illustrate the TSI POP apparatus embodiments and methods disclosed herein, a non-limiting list of examples is provided herein:

Example 1 is a semiconductor package, comprising: a semiconductor package substrate including a die side and a land side; a stiffener disposed on the die side, wherein the stiffener includes a die side and a package-on-package (POP) side, and wherein the stiffener includes a through-stiffener interconnect (TSI) that communicates from the die side to the POP side, wherein the TSI is electrically insulated with a TSI dielectric; and an electrical connection between the package substrate and the TSI.

In Example 2, the subject matter of Example 1 optionally includes wherein the electrical connection is coupled to at least one of a power or input/output (I/O) connection, further including wherein the stiffener also is coupled to the semiconductor package substrate at a source voltage structure.

In Example 3, the subject matter of any one or more of Examples 1-2 optionally include wherein the TSI is a first TSI located on the stiffener on a first rail portion, further including a subsequent TSI located in the stiffener on a subsequent rail portion that is opposite the first rail portion.

In Example 4, the subject matter of any one or more of Examples 1-3 optionally include wherein the TSI is a first TSI located on the stiffener on a first rail portion, further including a subsequent TSI located in the stiffener on a subsequent rail portion that is opposite the first rail portion; wherein the electrical connection is coupled to at least one of a power or input/output (I/O) connection; and wherein the stiffener also is coupled to the semiconductor package substrate at a source voltage structure.

In Example 5, the subject matter of any one or more of Examples 1-4 optionally include a semiconductive die disposed on the semiconductor package substrate die side, wherein the semiconductive die is coupled to the TSI.

In Example 6, the subject matter of Example 5 optionally includes a first semiconductive die disposed on the semiconductor package substrate die side, wherein the first semiconductive die is coupled to the TSI; and a subsequent semiconductive die disposed above the semiconductor package substrate die side, wherein the subsequent semiconductive die is electrically coupled to the semiconductor package substrate by a face-to-face connection with the first semiconductive die and a through-silicon via (TSV) through the first semiconductive die.

In Example 7, the subject matter of Example 6 optionally includes a package-on-package (POP) device seated on the stiffener, wherein the POP device is coupled to the TSI.

In Example 8, the subject matter of any one or more of Examples 1-7 optionally include a package-on-package (POP) device seated on the stiffener, wherein the POP device is coupled to the TSI.

In Example 9, the subject matter of any one or more of Examples 1-8 optionally include a package-on-package (POP) device seated on the stiffener, wherein the POP device is coupled to the TSI, wherein the POP device includes a memory die that is wirebonded and coupled to the TSI.

In Example 10, the subject matter of any one or more of Examples 1-9 optionally include wherein the TSI is a first TSI, wherein the first TSI is located on the stiffener on a first rail portion, further including: a package-on-package (POP) device seated on the stiffener, wherein the POP device is coupled to the first TSI; a subsequent TSI located in the stiffener on a subsequent rail portion that is opposite the first rail portion, wherein the subsequent TSI electrically contacts the semiconductor package substrate and the POP device.

In Example 11, the subject matter of any one or more of Examples 1-10 optionally include wherein the TSI is a first TSI, wherein the first TSI is located on the stiffener on a first rail portion, further including: a package-on-package (POP) device seated on the stiffener, wherein the POP device is coupled to the first TSI; a subsequent TSI located in the stiffener on a subsequent rail portion that is opposite the first rail portion, wherein the subsequent TSI electrically contacts the semiconductor package substrate and the POP device; a first semiconductive die disposed on the semiconductor package substrate die side, wherein the first semiconductive die is coupled to the TSI; a subsequent semiconductive die disposed above the semiconductor package substrate die side, wherein the subsequent semiconductive die is electrically coupled to the semiconductor package substrate by a face-to-face connection with the first semiconductive die and a through-silicon via (TSV) through the first semiconductive die; and a memory die disposed in the POP device, wherein the memory die is wirebonded and coupled to the TSI.

In Example 12, the subject matter of any one or more of Examples 1-11 optionally include a passive device disposed on the semiconductor package substrate land side, wherein the passive device is coupled to a semiconductive die disposed on the semiconductor package substrate die side, wherein the semiconductive die is coupled to the TSI.

In Example 13, the subject matter of any one or more of Examples 1-12 optionally include a passive device disposed on the semiconductor package substrate land side.

In Example 14, the subject matter of any one or more of Examples 1-13 optionally include wherein the stiffener is a TSI stiffener, further including: a subsequent stiffener disposed on the die side, wherein the TSI stiffener surrounds the subsequent stiffener; and a passive device bridging between the TSI stiffener and the subsequent stiffener, wherein the TSI stiffener is coupled to a source voltage structure within the semiconductor package substrate.

Example 15 is a process of forming a stiffener, comprising: forming a through-stiffener interconnect (TSI) contact corridor in a stiffener blank; filling the TSI contact corridor with a TSI dielectric; re-opening the TSI contact corridor in the TSI dielectric; and plating a metallic layer within the TSI contact corridor on the TSI dielectric.

In Example 16, the subject matter of Example 15 optionally includes wherein forming the TSI contact corridor is done by a drilling technique.

In Example 17, the subject matter of any one or more of Examples 15-16 optionally include wherein re-opening the TSI contact corridor is done with a drilling technique to leave the TSI dielectric covering the stiffener within the TSI contact corridor.

In Example 18, the subject matter of any one or more of Examples 15-17 optionally include wherein plating includes plating over the stiffener, followed by back-grinding to remove plating material except from within the TSI contact corridor.

In Example 19, the subject matter of any one or more of Examples 15-18 optionally include wherein plating a metallic layer within the TSI contact corridor on the TSI dielectric, results in a TSI within the stiffener, further including seating the stiffener on a semiconductor package substrate to connect the TSI.

In Example 20, the subject matter of any one or more of Examples 15-19 optionally include wherein plating a metallic layer within the TSI contact corridor on the TSI dielectric, results in a TSI within the stiffener, further including: seating the stiffener on a semiconductor package substrate to connect the TSI; and assembling a TSI POP device to the stiffener.

In Example 21, the subject matter of any one or more of Examples 15-20 optionally include wherein plating a metallic layer within the TSI contact corridor on the TSI dielectric, results in a TSI within the stiffener, further including: seating the stiffener on a semiconductor package substrate to connect the TSI; assembling a TSI POP device to the stiffener to achieve a TSI POP apparatus; and assembling the TSI POP apparatus to a computing system.

In Example 22, the subject matter of any one or more of Examples 15-21 optionally include wherein the stiffener is a TSI stiffener, further including: seating a subsequent stiffener on the die side, wherein the TSI stiffener surrounds the subsequent stiffener; and bridging a passive device between the TSI stiffener and the subsequent stiffener, wherein the TSI stiffener is coupled to a source voltage structure within the semiconductor package substrate.

Example 23 is a computing system, comprising: a semiconductor package substrate including a die side and a land side; a semiconductive die disposed on the die side; a stiffener disposed on the die side, wherein the stiffener includes a die side and a package-on-package (POP) side, and wherein the stiffener includes a first through-stiffener interconnect (TSI) that communicates from the die side to the POP side; an electrical connection between the package substrate and the first TSI, wherein the first TSI is located on the stiffener on a first rail portion; a POP device seated on the stiffener, wherein the POP device is coupled to the first TSI; a subsequent TSI located in the stiffener on a subsequent rail portion that is opposite the first rail portion, wherein the subsequent TSI electrically contacts the semiconductor package substrate and the POP device; a third rail portion between the first and subsequent rail portions, and a fourth rail portion opposite the third rail portion; and a board at which the land side is mounted by at least one electrical bump, and wherein the board includes a dielectric outer shell.

In Example 24, the subject matter of Example 23 optionally includes a subsequent semiconductive die disposed above the semiconductor package substrate die side, wherein the subsequent semiconductive die is electrically coupled to the semiconductor package substrate by a face-to-face connection with the first semiconductive die and a through-silicon via (TSV) through the first semiconductive die, wherein the first semiconductive die is a platform controller hub, and wherein the subsequent semiconductive die is a logic processor; a memory die disposed in the POP device, wherein the memory die is wirebonded and coupled to the TSI; and wherein the platform controller hub is part of a chipset.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package, comprising:
   a semiconductor package substrate including a die side and a land side;
   a through-stiffener interconnect (TSI) stiffener disposed on the die side, wherein the TSI stiffener includes a die side and a package-on-package (POP) side, and wherein the TSI stiffener includes a TSI that communicates from the die side to the POP side, wherein the TSI is electrically insulated with a TSI dielectric;
   an electrical connection between the package substrate and the TSI;
   a subsequent stiffener disposed on the die side, wherein the TSI stiffener surrounds the subsequent stiffener; and
   a passive device bridging between the TSI stiffener and the subsequent stiffener, wherein the TSI stiffener is coupled to a source voltage structure within the semiconductor package substrate.

2. A computing system, comprising:
   a semiconductor package substrate including a die side and a land side;
   a semiconductive die disposed on the die side;
   a stiffener disposed on the die side, wherein the stiffener includes a die side and a package-on-package (POP) side, and wherein the stiffener includes a first through-stiffener interconnect (TSI) that communicates from the die side to the POP side;
   an electrical connection between the package substrate and the first TSI, wherein the first TSI is located on the stiffener on a first rail portion;
   a POP device seated on the stiffener, wherein the POP device is coupled to the first TSI;
   a subsequent TSI located in the stiffener on a subsequent rail portion that is opposite the first rail portion, wherein the subsequent TSI electrically contacts the semiconductor package substrate and the POP device;
   a third rail portion between the first and subsequent rail portions, and a fourth rail portion opposite the third rail portion; and
   a board at which the land side is mounted by at least one electrical bump, and wherein the board includes a dielectric outer shell.

3. The computing system of claim 2, further including:
   a subsequent semiconductive die disposed above the semiconductor package substrate die side, wherein the subsequent semiconductive die is electrically coupled to the semiconductor package substrate by a face-to-face connection with the first semiconductive die and a through-silicon via (TSV) through the first semiconductive die, wherein the first semiconductive die is a platform controller hub, and wherein the subsequent semiconductive die is a logic processor;
   a memory die disposed in the POP device, wherein the memory die is wirebonded and coupled to the TSI; and
   wherein the platform controller hub is part of a chipset.

4. A semiconductor package, comprising:
   a semiconductor package substrate including a die side and a land side;

a stiffener disposed on the die side, wherein the stiffener includes a die side and a package-on-package (POP) side, and wherein the stiffener includes a first through-stiffener interconnect (TSI) that communicates from the die side to the POP side, wherein the first TSI is electrically insulated with a TSI dielectric, and wherein the first TSI is on a first rail portion of the stiffener;

an electrical connection between the package substrate and the first TSI, wherein the electrical connection is coupled to at least one of a power or input/output (I/O) connection, further including wherein the stiffener also is coupled to the semiconductor package substrate at a source voltage structure;

a subsequent TSI located in the stiffener on a subsequent rail portion that is opposite the first rail portion; and a semiconductive die disposed on the semiconductor package substrate die side, wherein the semiconductive die is coupled to the first TSI a board at which the land side is mounted by at least one electrical bump, and wherein the board includes a dielectric outer shell; and wherein the semiconductive die is a first semiconductive die, and further including a subsequent semiconductive die disposed above the semiconductor package substrate die side, and wherein the first semiconductive die and the subsequent semiconductive die are part of a chipset.

\* \* \* \* \*